United States Patent [19]

Teel et al.

[11] Patent Number: 5,495,446
[45] Date of Patent: Feb. 27, 1996

[54] PRE-CHARGED EXCLUSIONARY WIRED-CONNECTED PROGRAMMED REDUNDANT SELECT

[75] Inventors: Thomas A. Teel; David C. McClure, both of Carrollton, Tex.

[73] Assignee: SGS-Thomson Microelectronics, Inc., Carrollton, Tex.

[21] Appl. No.: 316,087

[22] Filed: Sep. 30, 1994

[51] Int. Cl.$^6$ .................................................... G11C 7/00
[52] U.S. Cl. ........................................ 365/200; 365/225.7
[58] Field of Search .............................. 365/200, 225.7, 365/96, 203, 230.06

[56] References Cited

U.S. PATENT DOCUMENTS

| 4,714,839 | 12/1987 | Chung | 365/200 |
| 5,140,554 | 8/1992 | Schreck | 365/225.7 |

*Primary Examiner*—A. Zarabian
*Attorney, Agent, or Firm*—Renee M. Larson; Lisa K. Jorgenson; Richard K. Robinson

[57] ABSTRACT

Therefore, according to the present invention, replacement of defective elements of an integrated circuit memory device by a redundant array is accomplished using a redundant decode scheme which is as fast as or faster than the standard decode. An exclusionary wired-connection redundant select circuit, which is programmable and pre-charged, allows the redundant array to be programmed such that any defective element may be replaced in a quick manner. The exclusionary wired-connection redundant select circuit is enabled by programming a programmable element of an enable circuit contained within the exclusionary wired-connection redundant select circuit and is programmed by disconnecting all programmable elements of the select circuit not representative of the defective element to be replaced. The output signal of the exclusionary wired-connection redundant select circuit propagates to decode output slave latch circuitry where it is latched and stored.

38 Claims, 3 Drawing Sheets

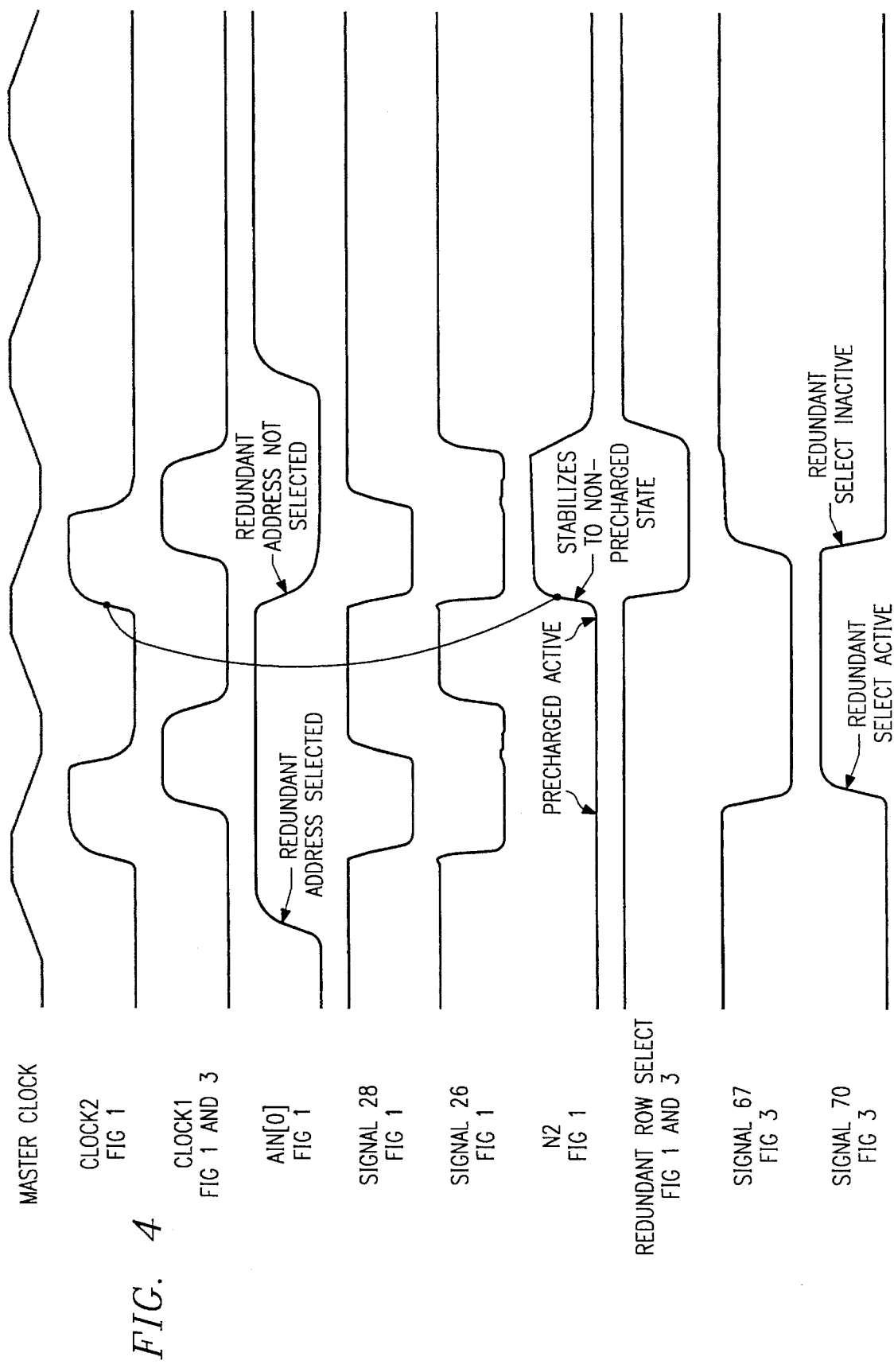

PRE-CHARGED EXCLUSIONARY WIRED-CONNECTED PROGRAMMED REDUNDANT SELECT

BACKGROUND OF THE INVENTION

The present invention relates generally to integrated circuit devices, and more specifically to high speed clocked memories having redundant arrays.

Redundant arrays are frequently used in memories to increase the overall yield above that which would normally be possible based on the random defect population density of a process. Random defect population density of a process may be caused by a number of factors, although particle defects, such as broken or shorted out rows, are the most normal cause of random process defects. Redundant row arrays, for example, are thus used to replace defective rows of the standard row array which are discovered during initial testing of the memory device. Redundant column arrays are similarly used to replace defective columns.

Continuing with the redundant row example, since it can not be known which row or rows of the standard row array may be defective, effective replacement of defective rows is accomplished using a redundant row array which may be programmed to replace any desired row of the standard row array. Programmability of the redundant row array is typically accomplished through the use of an electrical programming element, such as a laser fuse-link or anti-fuse, and a row decode tree. While this method provides the desired programmability, the result is, unfortunately, a redundant row array which is typically much slower than the normal row decode function.

This speed differential is especially of concern in high speed clocked memory devices where the overall memory access speed is often enhanced by pre-decoding much of the row addresses prior to the active clock edge during the address setup time. Thus, there is a current unmet need in the art to accomplish replacement of defective elements of the standard array with a redundant array in an efficient manner such that there is little or no speed differential between the normal decode function and the redundant decode function of the high speed clocked memory device.

SUMMARY OF THE INVENTION

It would be advantageous in the art to speed up the rate at which defective elements may be replaced from a redundant array in high speed clocked memory devices.

Therefore, according to the present invention, replacement of defective elements of an integrated circuit memory device by a redundant array is accomplished using a redundant decode scheme which is as fast as or faster than the standard decode. An exclusionary wired-connection redundant select circuit, which is programmable and pre-charged, allows the redundant array to be programmed such that any defective element may be replaced in a quick manner.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 4 is a timing diagram, according to the present invention.

DESCRIPTION OF THE INVENTION

In high speed clocked memory devices, the overall memory access speed is often enhanced by performing a pre-decoding function of much of the row or column addresses prior to the active edge of the clock during the address setup time. The present invention utilizes this principle to render a redundant decode scheme which is as fast as or faster than the standard decode. The present invention is equally effective for replacement of various defective elements, such as both defective rows and defective columns. An exclusionary wired-connection redundant select circuit, which is programmable and pre-charged, allows the redundant array to be programmed such that any defective element may be replaced in a quick manner.

Figure 1:
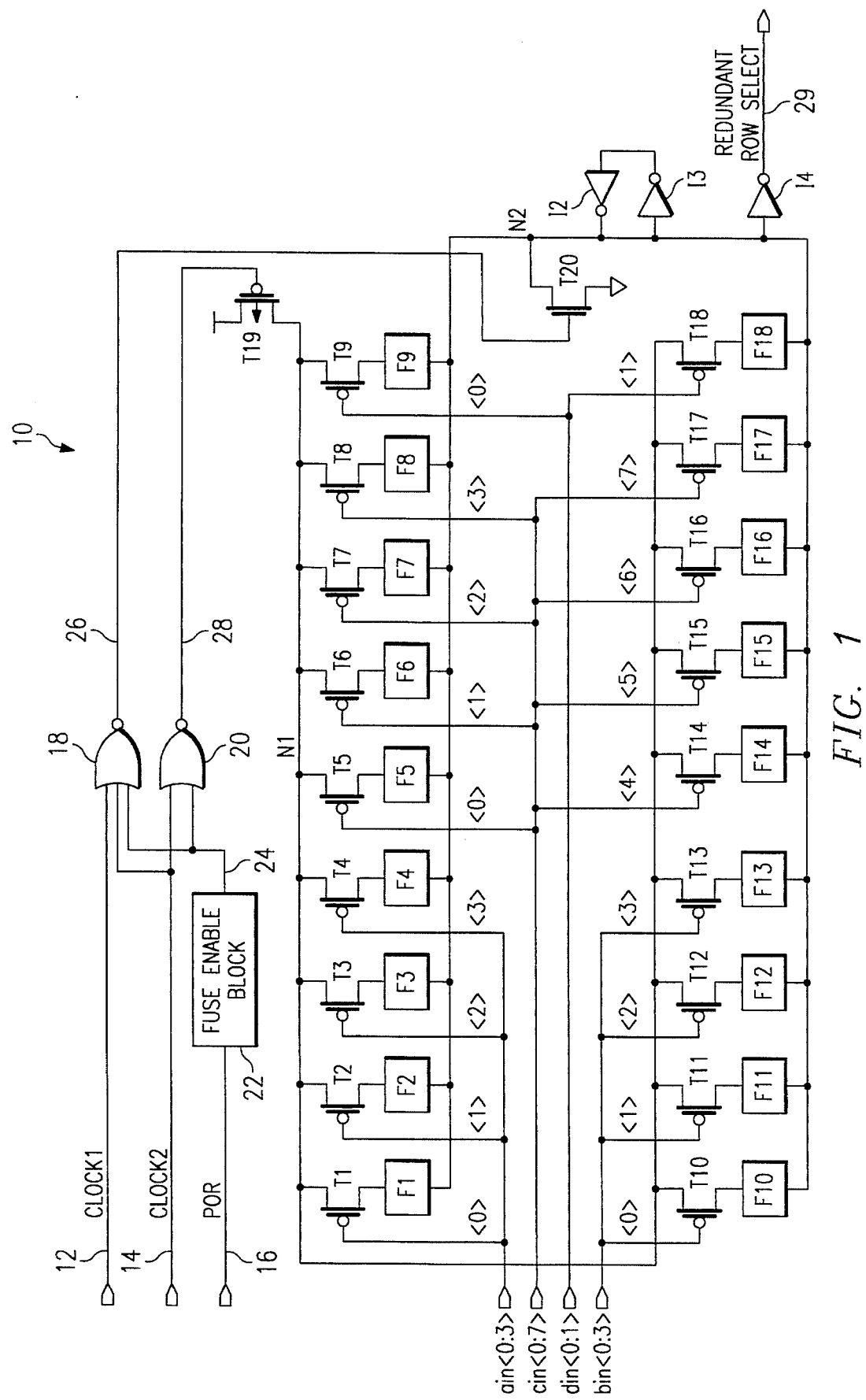
FIG. 1 is a schematic diagram of exclusionary wired-AND redundant row select circuitry, according to the present invention.

Referring to FIG. 1, exclusionary wired-AND redundant row select circuitry 10 is shown. The wired-connection shown in FIG. 1 is wired-AND. It is recognized, however, that other types of wired-connections may be used. A wired-OR scheme, for instance, may be used by simply changing the polarity of transistors T1 to T19 from p-channel to n-channel transistors, changing the polarity of transistor T20 from a n-channel to p-channel transistor, and reversing the polarity of the supply voltages Vcc and Vss.

Circuitry 10 has a number of address input signals ain<0:3>, bin<0:3>, cin<0:7>, and din<0:1> which control a number of transistors which are in turn connected to removable laser fuse links that are programmable elements. The address input signals may be address signals directly or they may be derivatives of address signals derived from an address pre-decoding scheme, for instance. One skilled in the art will appreciate that other programmable elements, such as anti-fuses and active devices such as PROMs (Programmable Read Only Memories), EPROMs (Erasable Programmable Read Only Memories), EEPROMs (Electrically Erasable Programmable Read Only Memories, and Flash EPROMs, may be used in lieu of the laser fuse links. Circuitry 10 is programmed upon appropriate programming of the laser fuse links by leaving intact the laser fuse links corresponding to the row address combination which is to be replaced, thereby excluding all but the selected replacement row address. If anti-fuses are used, the appropriate programming would be accomplished by simply leaving intact the anti-fuses corresponding to row address combinations which are not to be replaced.

Input signals ain<0:3> control the gates of p-channel transistors T1, T2, T3, and T4; a first source/drain of transistors T1, T2, T3, and T4 in turn are connected to a first terminal of laser fuse links F1, F2, F3, and F4, respectively, as shown. Input signals bin<0:3> control the gates of p-channel transistors T10, T11, T12, and T13; a first source/drain of transistors T10, T11, T12, and T13 in turn are connected to a first terminal of laser fuse links F10, F11, F12, and F13, respectively. Input signals cin<0:7> control the gates of p-channel transistors T5, T6, T7, T8, T14, T15, T16, and T17; a first source/drain of transistors T5, T6, T7, T8, T14, T15, T16, and T17 are in turn connected to a first terminal of laser fuse links F5, F6, F7, F8, F14, F15, F16, and F17. Finally, input signals din<0:1> control the gates of p-channel transistors T9 and T18; a first source/drain of transistors T9 and T18 in turn are connected to a first terminal of laser fuse links F9 and F18.

The other input signals to circuitry 10 are controlling clock signals Clock1 and Clock2, and power on reset signal POR (an active low signal). POR is an input signal to Fuse Enable Block 22 which contains fuse-based circuitry which enables circuitry 10 and is shown and described in conjunction with FIG. 2. The output signal 24 of Fuse Enable Block 22, and controlling clock signals Clock1 and Clock 2 are input signals to NOR gate 18 and together determine the state of signal 26. Similarly, signal 24 and controlling clock signal Clock2 are input signals to NOR gate 20 and thus together determine the state of signal 28. Signal 26 controls the gate of pull-down transistor T20, and signal 28 controls the gate of pull-up transistor T19. Even though two controlling signals Clock1 and Clock 2 are shown and described with regard to FIG. 1, it is recognized that with only minor circuit changes, one clock signal could be an input signal to both NOR gate 18 and NOR gate 20 such that a single clock signal would control the gate of pull-up transistor T19 and pull-down transistor T20. Thus, while two clock signals are shown in the preferred embodiment of FIG. 1, it is understood that only a single clock signal is necessary.

A first source/drain of pull-up transistor T19 is connected to supply Vcc, and a second source/drain of transistor T19 is connected to each of the second source/drains of transistors T1 through T18, inclusive, to form node N1. A first source/drain of pull-down transistor T20 is connected to supply Vss, and a second source/drain of transistor T20 is connected to laser fuse links F1 to F18, inclusive, as well as the inputs of inverters 13 and 14, and the output of inverter 12 to form node N2. The output of inverter 13 is connected to the input of 12 to form a weak latch which is easily overcome. Redundant Row Select signal 29, the output signal of inverter 14, is the output signal of circuitry 10.

Figure 2:
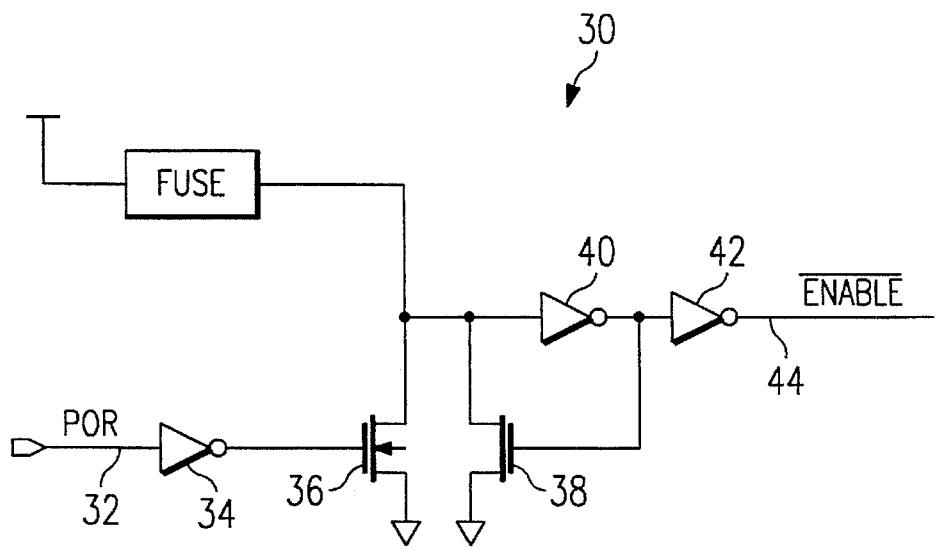
FIG. 2 is a schematic diagram of fuse enable circuitry, according to the present invention.

Referring now to FIG. 2, fuse enable circuitry 30 is the circuitry contained within Fuse Enable Block 22 of FIG. 1, and it allows circuitry 10 of FIG. 1 to be enabled. Fuse enable circuitry 30 is comprised of laser fuse link FUSE, inverters 34, 40, 42, and transistors 36 and 38. Power on reset signal POR 32 is equivalent to POR signal 16 of FIG. 1. Circuitry 10 is enabled upon programming a programmable element of fuse enable circuitry 30; thus, disconnecting laser fuse link FUSE enables circuitry 10 of FIG. 1. When FUSE is blown, Enable bar signal 44 is a logic low level and circuitry 10 of FIG. 1 is enabled. On the other hand, allowing laser fuse link FUSE to remain intact means that circuitry 10 is not enabled. Enable bar signal 44 is equivalent to output signal 24 of Fuse Enable Block 22 of FIG. 1.

It is assumed that laser fuse link FUSE of fuse enable circuitry 30 has been disconnected and thus circuitry 10 of FIG. 1 is now enabled. Referring again to FIG. 1, circuitry 10 is pre-charged to a selected state during the inactive portions of controlling clock signals Clock1 and Clock2. During this period, the address input signals which are representative of the defective row to be replaced become valid at decode circuitry 10. When the active edge of the controlling clock is detected, pre-charging of circuitry 10 ceases, and the current state of Redundant Row Select output signal 29 of exclusionary wired-OR redundant row select circuitry 10 is transmitted to and stored in output latch circuitry to be described in conjunction with FIG. 3.

Figure 3:
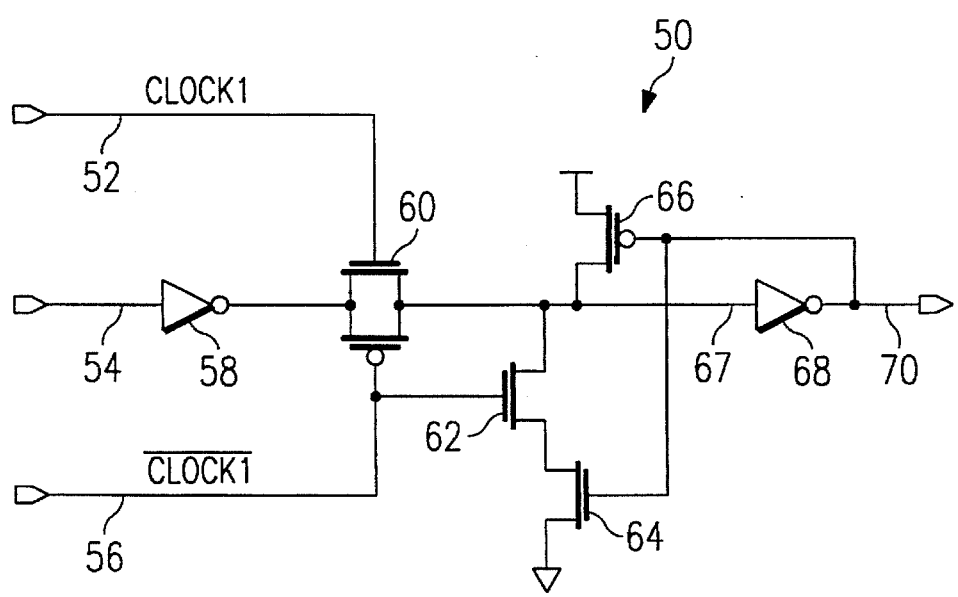
FIG. 3 is a schematic diagram of row decode output slave latch circuitry, according to the present invention.

Referring now to FIG. 3, row decode output slave latch circuitry 50 captures and stores Redundant Row Select signal 29 of FIG. 1. Circuitry 50 is comprised of inverters 58 and 68, passgate 60, and transistors 62, 64, and 66. Clock1 input signal 52 is equivalent to Clock1 signal 12 of FIG. 1; Clock1 bar signal 56 is simply the inverse of Clock1 signal 52. Signal 67 is the output signal of passgate 60 and input signal of inverter 68. Redundant Row Select signal 54 is equivalent to Redundant Row Select signal 29 of FIG. 1.

Following is an example of how the present inventions works. Assume that the row addressed by address input signals ain<0>, bin<0>, cin<0>, and din<0> is defective and thus is to be replaced from the redundant row array. All the laser fuse links which do not correspond to the defective row must be removed; thus, all laser fuse links of FIG. 1, except for laser fuse links F1, F5, F9, and F10 which do correspond to the defective row are disconnected by blowing the laser fuse link. Also, the laser fuse link FUSE of FIG. 2 must be disconnected so that circuitry 10 of FIG. 1 is rendered operational.

When controlling clock signals Clock1 and Clock2 are both inactive (logic low), node N2 of FIG. 1 is pre-charged to a logic low or row selected condition. Address input signals ain<0>, bin<0>, cin<0>, and din<0> also become valid and stable when controlling clock signals Clock1 and Clock2 are inactive. When controlling clock signals Clock1 and Clock2 go to an active or high logic level, the state of node N1 resolves to the correct logic state based on address input signals ain<0>, bin<0>, cin<0>, and din<0>. If all address input signals ain<0>, bin<0>, cin<0>, and din<0> are a high logic level, then node N2 remains low and selected. If, however, any of address input signals ain<0>, bin<0>, cin<0>, and din<0> are a low logic level, then node N2 goes high to a deselected state. This resolved logic state at node N1 propagates through as Redundant Row Select signal 29 of FIG. 1 into the row decode output slave latch circuitry 50 of FIG. 3 where it is stored. The timing diagram of the present invention with regard to FIGS. 1 and 3 is shown in FIG. 4.

The redundant decode scheme of the present invention allows defective elements, such as rows or columns, of a high speed clocked memory device to be replaced from a redundant array without unnecessarily slowing down the memory device. The pre-charged and programmable exclusionary wired-connection redundant select circuit of the present invention provides for the programming of the address of any defective element such that the defective element may be replaced in a quick manner. After the exclusionary wired-connection redundant select circuit is enabled, it is programmed by removing all programmable elements, such as anti-fuses, laser fuse links, and active devices, not representative oil the defective element to be replaced. The redundant decode scheme offers the advantage of being as fast as or faster than the standard decode function.

While the invention has been particularly shown and described with reference to a preferred embodiment, it will be understood by those skilled in the art that various changes in form and detail may be made therein without departing from the spirit and scope of the invention.

What is claimed is:

1. A redundant decode structure of a high speed clocked memory device, comprising:

a plurality of programmable elements of an exclusionary wired-connection redundant select circuit;

a plurality of address input signals which are connected to and control the plurality of programmable elements;

a first controlling clock input signal, provided to the plurality of programmable elements, characterized as having an active portion and an inactive portion;

an enable circuit connected to the plurality of programmable elements which enables or disables the exclusionary wired-connection redundant select circuit;

means, connected to the plurality of programmable elements, for programming an address of a defective element of the high speed clocked memory device by disconnecting all the programmable elements of the plurality of programmable elements of the exclusionary wired-connection redundant select circuit which are not representative of the address of the defective element from their corresponding address input signals of the plurality of address input signals, wherein, after programming the address of the defective element, during the inactive portion of the first controlling clock the address of the defective element becomes valid; and an output signal of the exclusionary wired-connection redundant select circuit connected to the means for programming an address of a defective element of the high speed clocked memory device.

2. The structure of claim 1, wherein the plurality of programmable elements of the exclusionary wired-connection redundant select circuit are laser fuse links.

3. The structure of claim 1, wherein the enable circuit enables the exclusionary wired-connection redundant select circuit upon programming of a programmable element of the enable circuit.

4. The structure of claim 3, wherein the programmable element of the enable circuit is a laser fuse link and programming the laser fuse link is accomplished by disconnecting the laser fuse link.

5. The structure of claim 1, wherein the exclusionary wired-connection redundant select circuit is pre-charged to a selected state during the inactive portion of the first controlling clock input signal.

6. The structure of claim 5, wherein the pre-charging of the exclusionary wired-connection redundant select circuit is terminated during an active portion of a second controlling clock input signal, and after termination of the pre-charging, the output signal resolves to a logic state that is determined by the address input signals.

7. The structure of claim 6, wherein the plurality of address input signals are stable when the pre-charging of the exclusionary wired-connection redundant select circuit is terminated.

8. The structure of claim 1, wherein during pre-charging of the exclusionary wired-connection redundant select circuit to a level of a first supply voltage, the programmable elements are disconnected from a second supply voltage and the output signal is pre-charged to the level of the first supply voltage.

9. The structure of claim 1, wherein the exclusionary wired-connection redundant select circuit is an exclusionary wired-connection redundant row select circuit and the defective element is a defective row.

10. The structure of claim 1, wherein the exclusionary wired-connection redundant select circuit further comprises:

a plurality of transistor elements of a first polarity, wherein a first source/drain of each of the transistor elements is connected to a first supply voltage via a first pull-up/pull-down transistor of the first polarity, a second source/drain of each of the transistor elements is connected to a first terminal of each of the plurality of programmable elements, a gate of each of the transistor elements is controlled by a different address input signal of the plurality of address input signals; wherein a gate of the first pull-up/pull-down transistor is controlled by a second controlling clock input signal; a second terminal of each of the plurality of programmable elements is connected to a second supply voltage via a second pull-up/pull-down transistor of a second polarity, wherein a gate of the second pull-up/pull-down transistor is controlled by the first controlling clock input signal.

11. The structure of claim 1, wherein the exclusionary wired-connection redundant select circuit further comprises:

a plurality of transistor elements of a first polarity, wherein a first source/drain of each of the transistor elements is connected to a first supply voltage via a first pull-up/pull-down transistor of the first polarity, a second source/drain of each of the transistor elements is connected to a first terminal of each of the plurality of programmable elements, a gate of each of the transistor elements is controlled by a different address input signal of the plurality of address input signals; wherein a gate of the first pull-up/pull-down transistor is controlled by the first controlling clock input signal; a second terminal of each of the plurality of programmable elements is connected to a second supply voltage via a second pull-up/pull-down transistor of a second polarity, wherein a gate of the second pull-up/pull-down transistor is controlled by the first controlling clock input signal.

12. The structure of claim 1, wherein the exclusionary wired-connection redundant select circuit is an exclusionary wired-AND redundant select circuit.

13. A redundant decode structure of a high speed clocked memory device, comprising:

a plurality of programmable elements of an exclusionary wired-connection redundant select circuit;

a plurality of address input signals which are connected to and control the plurality of programmable elements;

a first controlling clock input signal, provided to the plurality of programmable elements, characterized as having an active portion and an inactive portion;

an enable circuit connected to the plurality of programmable elements which enables or disables the exclusionary wired-connection redundant select circuit;

means, connected to the plurality of programmable elements, for programming an address of a defective element of the high speed clocked memory device by disconnecting all the programmable elements of the plurality of programmable elements of the exclusionary wired-connection redundant select circuit which are not representative of the address of the defective element from their corresponding address input signals of the plurality of address input signals, wherein, after programming the address of the defective element, during the inactive portion of the first controlling clock the address of the defective element becomes valid;

an output signal of the exclusionary wired-connection redundant select circuit connected to the means for programming an address of a defective element of the high speed clocked memory device; and means for storing the output signal of the exclusionary wired-connection redundant select circuit.

14. The structure of claim 13, wherein the plurality of programmable elements of the exclusionary wired-connection redundant select circuit are laser fuse links.

15. The structure of claim 13, wherein the enable circuit enables the exclusionary wired-connection redundant select circuit upon programming of a programmable element of the enable circuit.

16. The structure of claim 15, wherein the programmable element of the enable circuit is a laser fuse link and programming the laser fuse link is accomplished by disconnecting the laser fuse link.

17. The structure of claim 13, wherein the exclusionary wired-connection redundant select circuit is pre-charged to a selected state during the inactive portion of the first controlling clock input signal.

18. The structure of claim 17, wherein the pre-charging of the exclusionary wired-connection redundant select circuit is terminated during an active portion of a second controlling clock input signal, and after termination of the pre-charging, the output signal resolves to a logic state that is determined by the address input signals.

19. The structure of claim 18, wherein the address input signals are stable when the pre-charging of the exclusionary wired-connection redundant select circuit is terminated.

20. The structure of claim 18, wherein the resolved logic state of the output signal controls the output of a latch during the active state of the first controlling clock input signal.

21. The structure of claim 20, wherein during the inactive portion of the first controlling clock input signal, the latch stores the output signal from the active portion of the first controlling clock input signal which preceded the inactive portion.

22. The structure of claim 13, wherein during pre-charging of the exclusionary wired-connection redundant select circuit to a level of a first supply voltage, the programmable elements are disconnected from a second supply voltage and the output signal is pre-charged to the level of the first supply voltage.

23. The structure of claim 13, wherein the exclusionary wired-connection redundant select circuit is an exclusionary wired-connection redundant row select circuit and the defective element is a defective row.

24. The structure of claim 13, wherein the exclusionary wired-connection redundant select circuit further comprises:

a plurality of transistor elements of a first: polarity, wherein a first source/drain of each of the transistor elements is connected to a first supply voltage via a first pull-up/pull-down transistor of the first polarity, a second source/drain of each of the transistor elements is connected to a first terminal of each of the plurality of programmable elements, a gate of each of the transistor elements is controlled by a different address input signal of the plurality of address input signals; wherein a gate of the first pull-up/pull-down transistor is controlled by a second controlling clock input signal; a second terminal of each of the plurality of programmable elements is connected to a second supply voltage via a second pull-up/pull-down transistor of a second polarity, wherein a gate of the second pull-up/pull-down transistor is controlled by the first controlling clock input signal.

25. The structure of claim 13, wherein the exclusionary wired-connection redundant select circuit further comprises:

a plurality of transistor elements of a first polarity, wherein a first source/drain of each of the transistor elements is connected to a first supply voltage via a first pull-up/pull-down transistor of the first polarity, a second source/drain of each of the transistor elements is connected to a first terminal of each of the plurality of programmable elements, a gate of each of the transistor elements is controlled by a different address input signal of the plurality of address input signals; wherein a gate of the first pull-up/pull-down transistor is controlled by the first controlling clock input signal; a second terminal of each of the plurality of programmable elements is connected to a second supply voltage via a second pull-up/pull-down transistor of a second polarity, wherein a gate of the second pull-up/pull-down transistor is controlled by the first controlling clock input signal.

26. A method for replacing defective elements of a high speed clocked memory device, comprising the steps of:

enabling an exclusionary wired-connection redundant select circuit, wherein the exclusionary wired-connection redundant select circuit has a plurality of address input signals which are connected to and control a plurality of programmable elements; a first controlling clock input signal, provided to the plurality of programmable elements, characterized as having an active portion and an inactive portion; an enable circuit connected to the plurality of programmable elements which performs the step of enabling the exclusionary wired-connection redundant select circuit;

programming an address of a defective element of the high speed clocked memory device by disconnecting all the programmable elements of the plurality of programmable elements of the exclusionary wired-connection redundant select circuit which are not representative of the address of the defective element from their corresponding address input signals of the plurality of address input signals; and enabling a redundant element having the same address as the address of the defective element; and wherein after the step of programming the address of the defective element, during the inactive portion of the first controlling clock the address of the defective element becomes valid.

27. The method of claim 26, wherein the exclusionary wired-connection redundant select circuit is enabled upon programming a programmable element of the enable circuit.

28. The method of claim 27, wherein the programmable element of the enable circuit is a laser fuse link and programming the laser fuse link is accomplished by disconnecting the laser fuse link.

29. The method of claim 26, wherein the plurality of programmable elements of the exclusionary wired-connection redundant select circuit are laser fuse links.

30. The method of claim 26, wherein the exclusionary wired-connection redundant select circuit is pre-charged to a selected state during the inactive portion of the first controlling clock input signal.

31. The method of claim 30, wherein the pre-charging of the exclusionary wired-connection redundant select circuit is terminated during an active portion of a second controlling clock input signal, and after termination of the pre-charging, an output signal of the exclusionary wired-connection redundant select circuit resolves to a logic state that is determined by the address input signals.

32. The method of claim 31, wherein the address input signals are stable when the pre-charging of the exclusionary wired-connection redundant select circuit is terminated.

33. The method of claim 26, wherein during pre-charging of the exclusionary wired-connection redundant select circuit to a level of a first supply voltage, the programmable elements are disconnected from a second supply voltage and an output signal of the exclusionary wired-connection redundant select circuit is pre-charged to the level of the first supply voltage.

34. The method of claim 26, wherein the exclusionary wired-connection redundant select circuit is an exclusionary wired-connection redundant row select circuit and the defective element is a defective row.

35. The method of claim 26, after the step of programming the address of the defective element and before the step of enabling the redundant element, comprising the further step of:

storing an output signal of the exclusionary wired-connection redundant select circuit.

36. The method of claim 35, wherein a resolved logic state of the output signal of the exclusionary wired-connection redundant select circuit controls an output signal of a latch during the active state of the first controlling clock input signal.

37. The method of claim 36, wherein during the inactive portion of the first controlling clock input signal, the latch stores the output signal of the exclusionary wired-connection redundant select circuit from the active portion of the first controlling clock input signal which preceded the inactive portion.

38. The method of claim 26, wherein the exclusionary wired-connection redundant select circuit is an exclusionary wired-AND redundant select circuit.

* * * * *